United States Patent [19]

Emmel

[11] 3,951,713

[45] Apr. 20, 1976

[54] METHOD AND APPARATUS FOR INSULATING ELECTRICALLY CONDUCTIVE ELEMENTS

[75] Inventor: Leroy L. Emmel, Costa Mesa, Calif.

[73] Assignee: Fortin Laminating Corporation, San Fernando, Calif.

[22] Filed: Jan. 20, 1975

[21] Appl. No.: 542,213

Related U.S. Application Data

[62] Division of Ser. No. 426,246, Dec. 19, 1973, which is a division of Ser. No. 93,949, Dec. 1, 1970, Pat. No. 3,802,974.

[52] U.S. Cl. .............................. 156/52; 156/179; 156/201; 156/212; 156/306; 156/311; 156/312
[51] Int. Cl.² ................... H01B 13/06; B32B 31/08; B32B 31/20
[58] Field of Search ............ 156/52, 179, 290, 311, 156/312, 322, 306, 201, 212; 174/117 F, 117 FF

[56] References Cited
UNITED STATES PATENTS

| | | | |
|---|---|---|---|
| 2,361,374 | 10/1944 | Abbott | 156/55 |
| 3,082,292 | 3/1963 | Gore | 156/55 |
| 3,239,396 | 3/1966 | Bohannon, Jr. | 156/52 |
| 3,392,070 | 7/1968 | Gropp | 156/55 |
| 3,513,045 | 5/1970 | Emmel et al. | 156/55 |

*Primary Examiner*—Daniel J. Fritsch
*Attorney, Agent, or Firm*—Raymond L. Madsen

[57] ABSTRACT

A method and apparatus for insulating a plurality of electrically conductive elements and to produce electrical cable where the method includes heating the unformed insulative material and conductive elements, applying pressure and simultaneously removing heat with a pair of rollers at a relatively low temperature and applying pressure and heat to preselected regions only of the insulative material. The method and apparatus further allow preselected portions of the cable to be unbonded so as to facilitate access to the conductive elements by simply interrupting the application of pressure to the preselected portions. The heat, press and cool and press and bond method may also be accomplished in a step and repeat process using presses to insulative flexible circuits. The above method and apparatus provide more reliable bonding at an accelerated rate of production.

1 Claim, 15 Drawing Figures

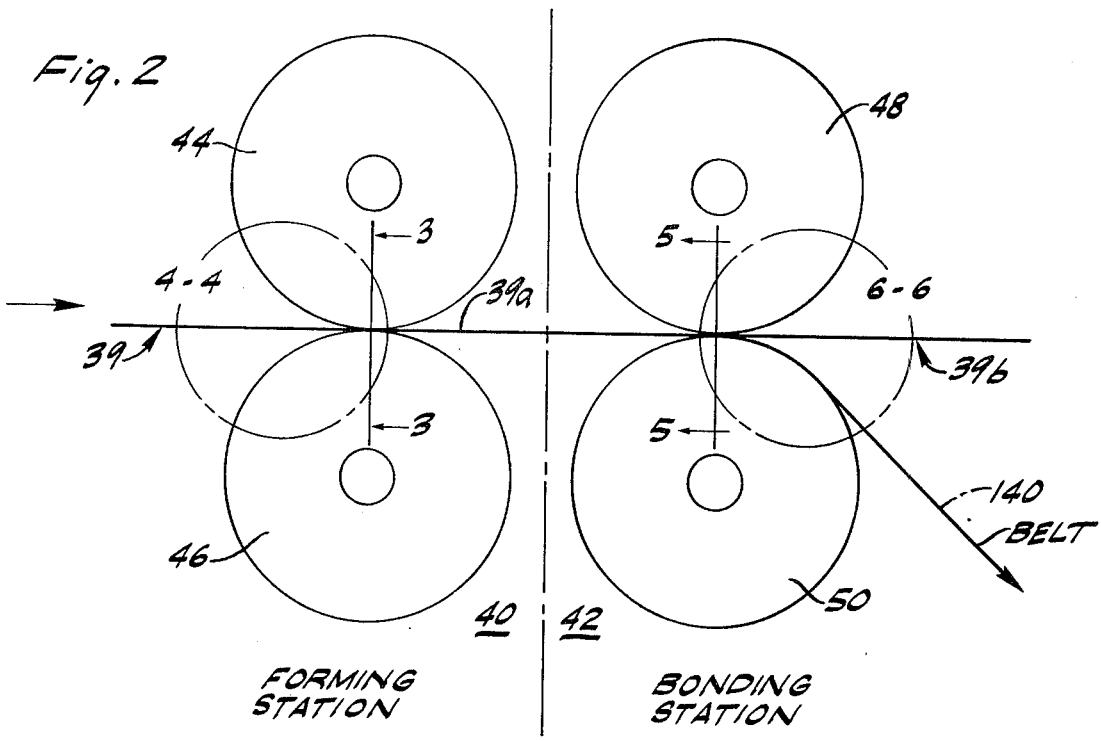
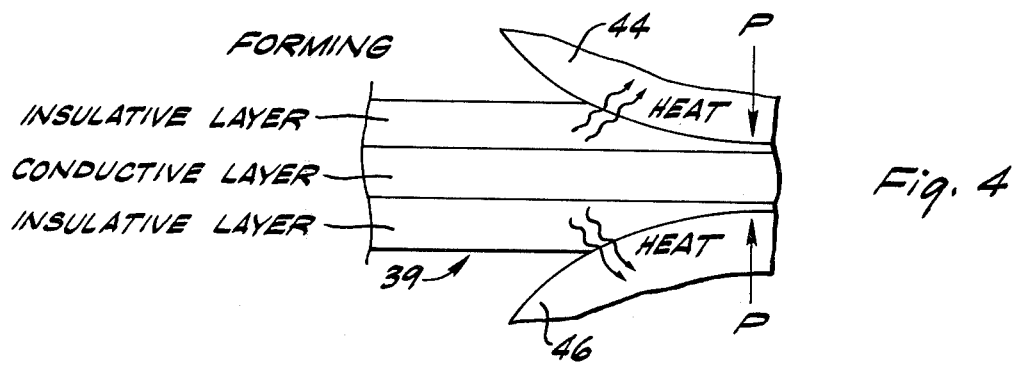
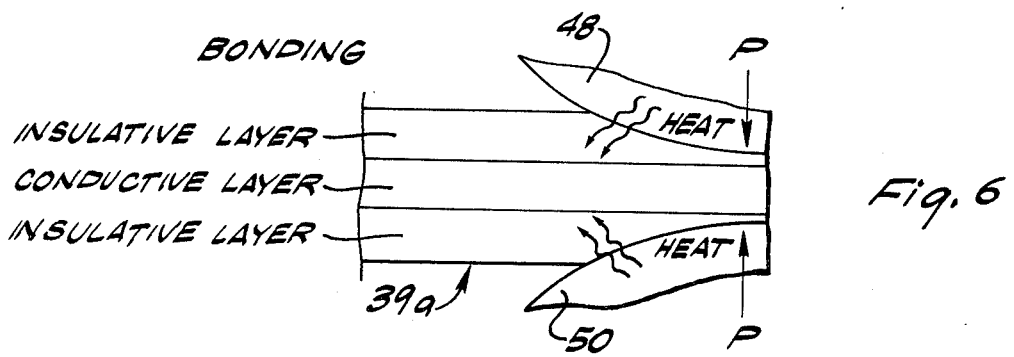

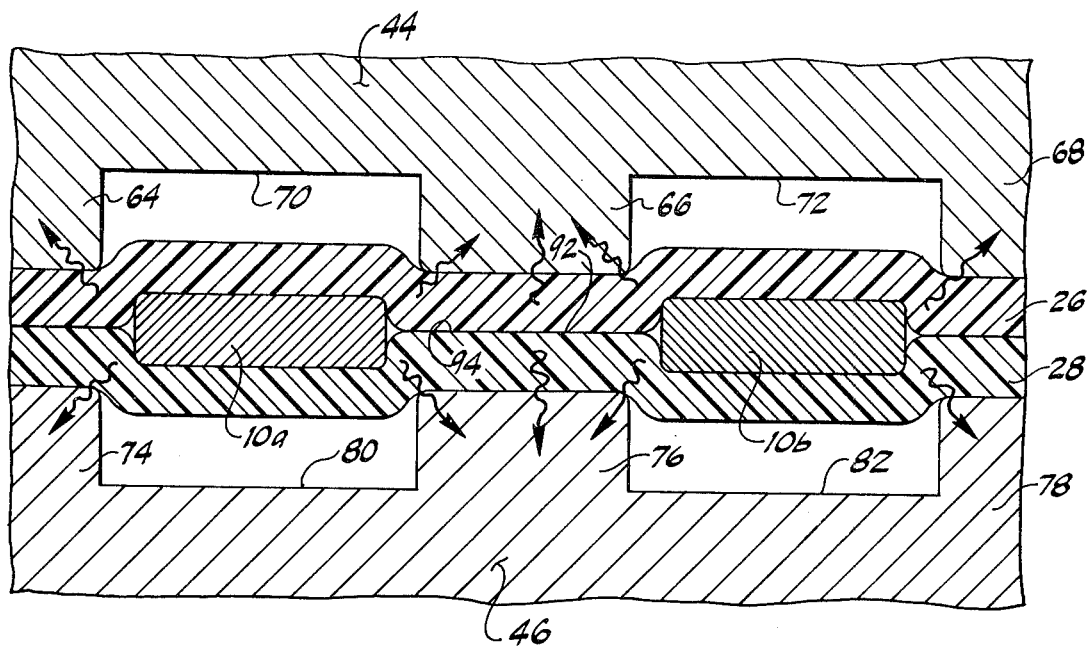
Fig. 3 (FORMING)
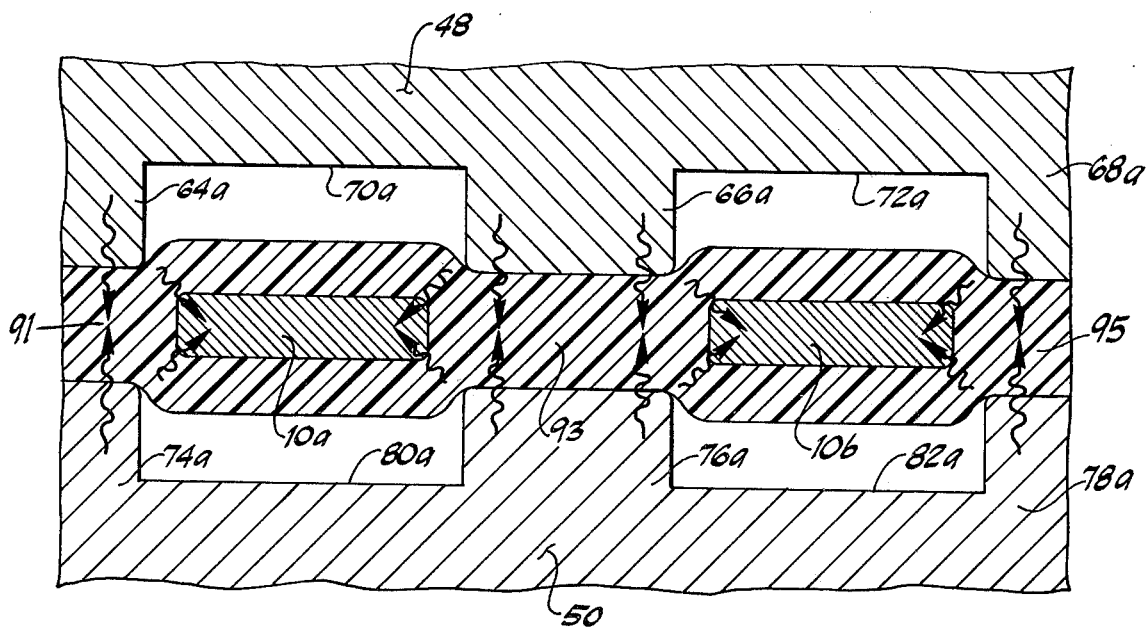
Fig. 5 (BONDING)

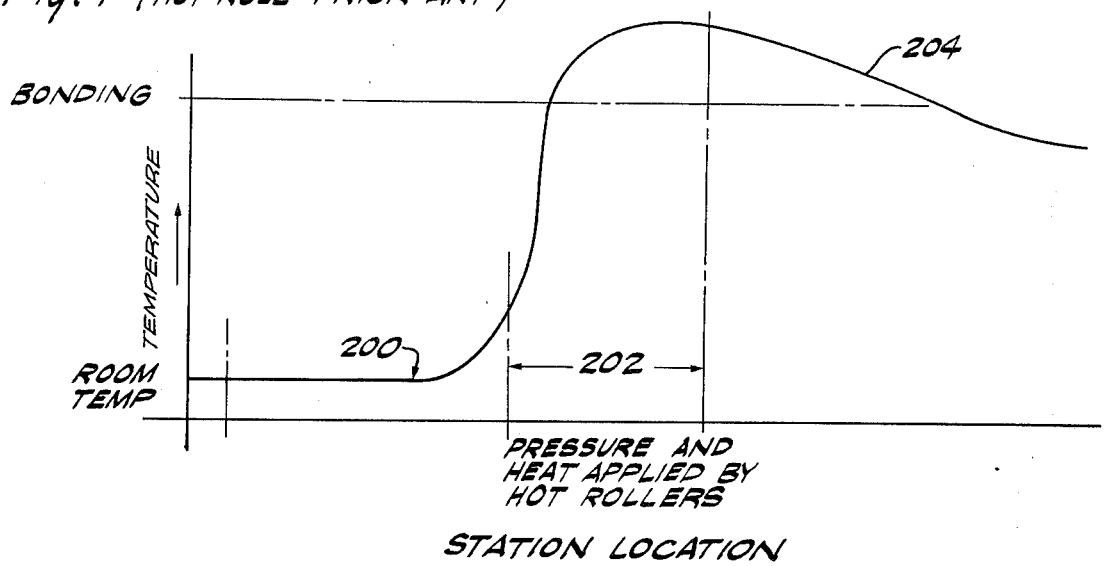
Fig. 7 (HOT ROLL - PRIOR ART)
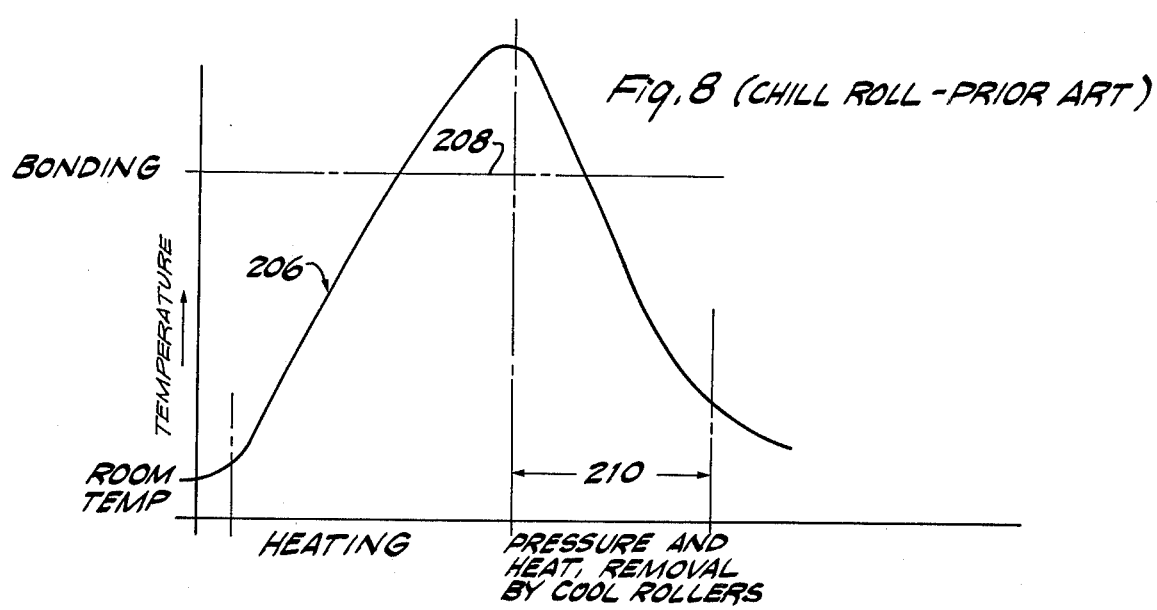
Fig. 8 (CHILL ROLL - PRIOR ART)
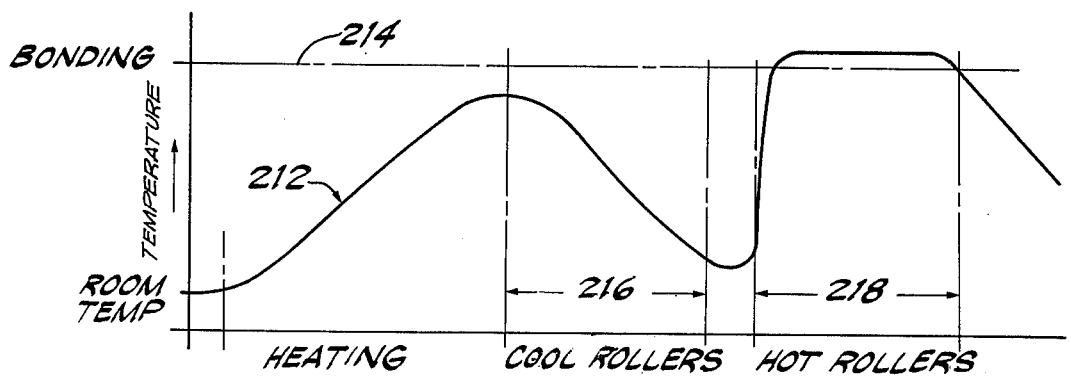
Fig. 9

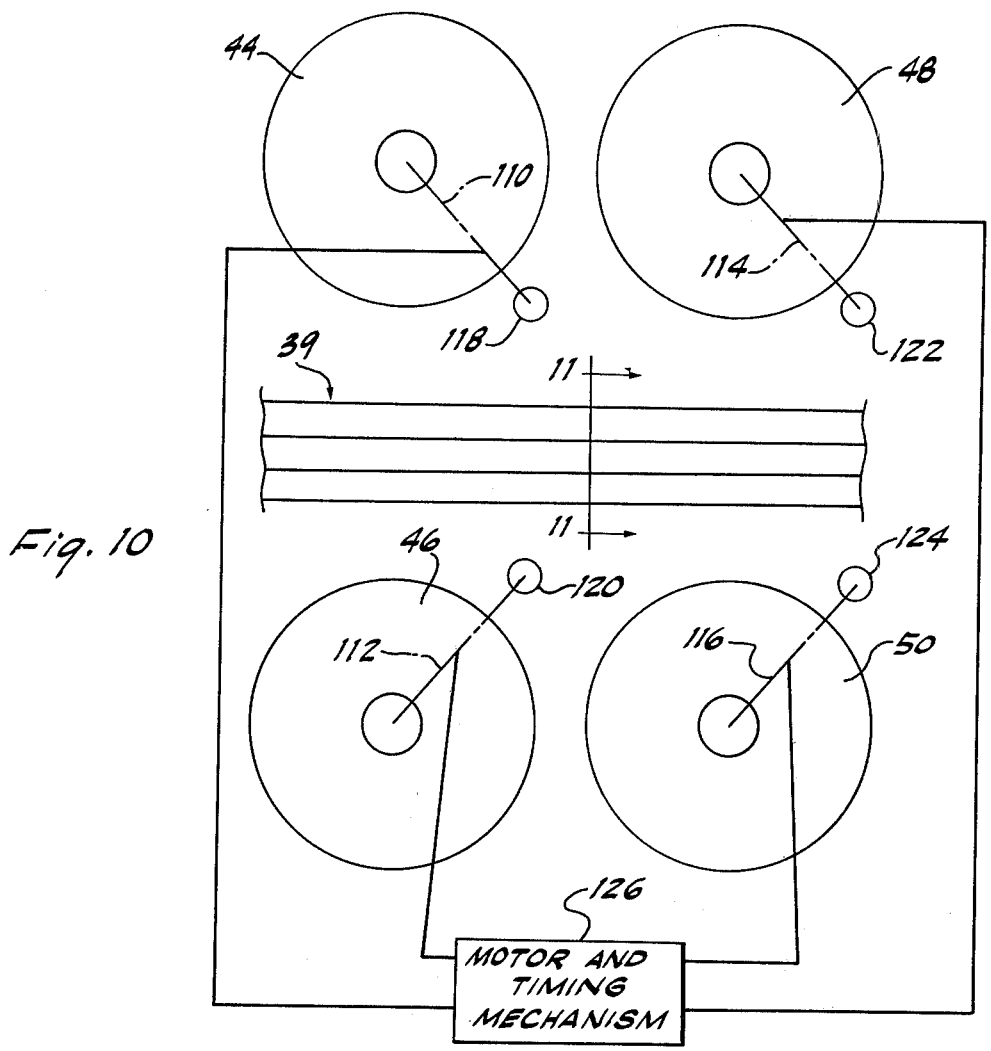
Fig. 10
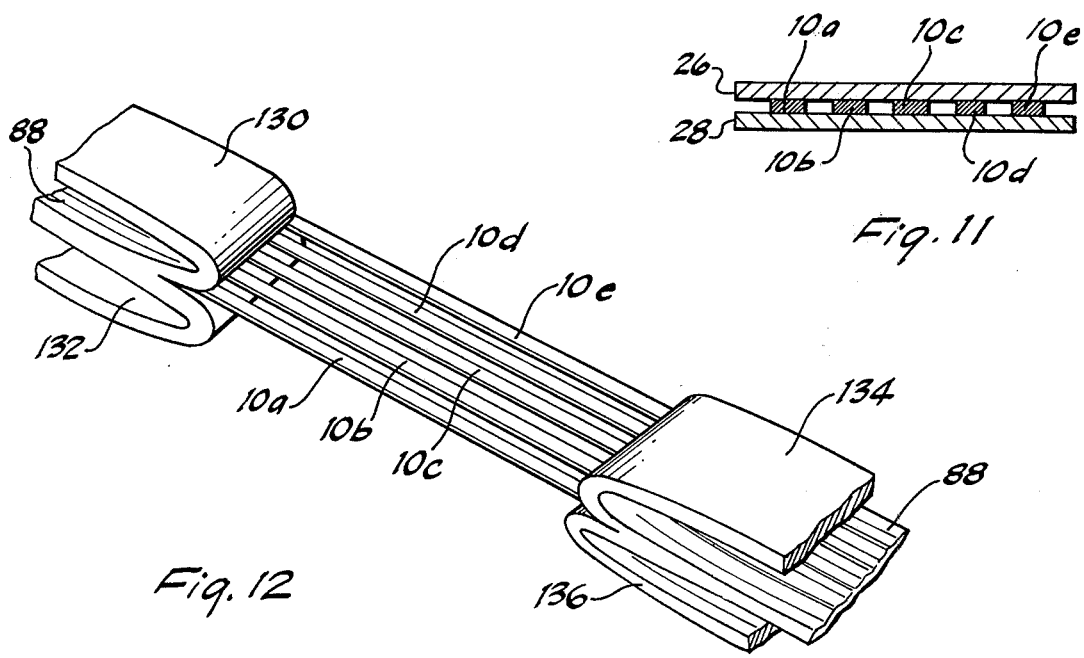
Fig. 11
Fig. 12

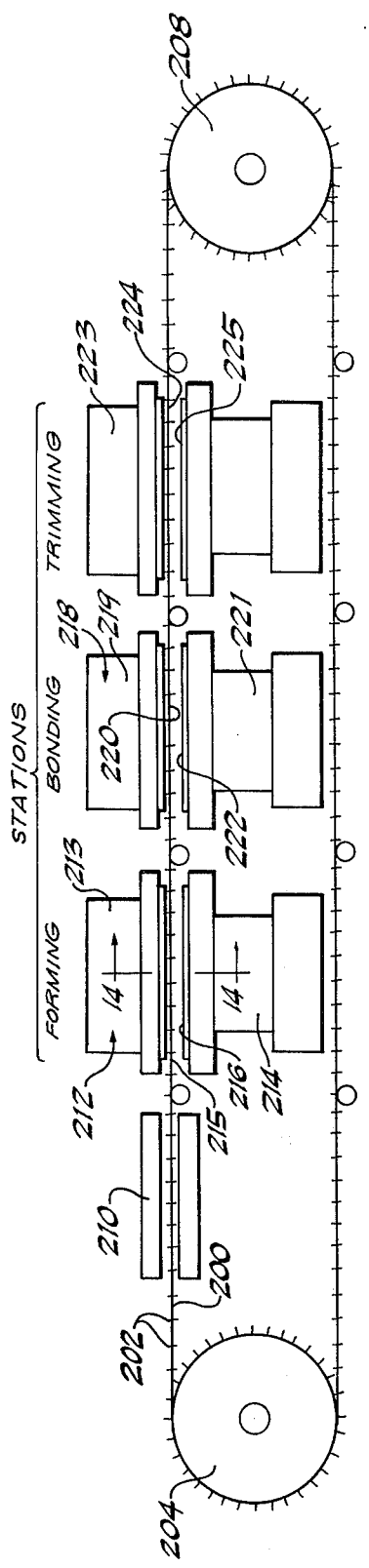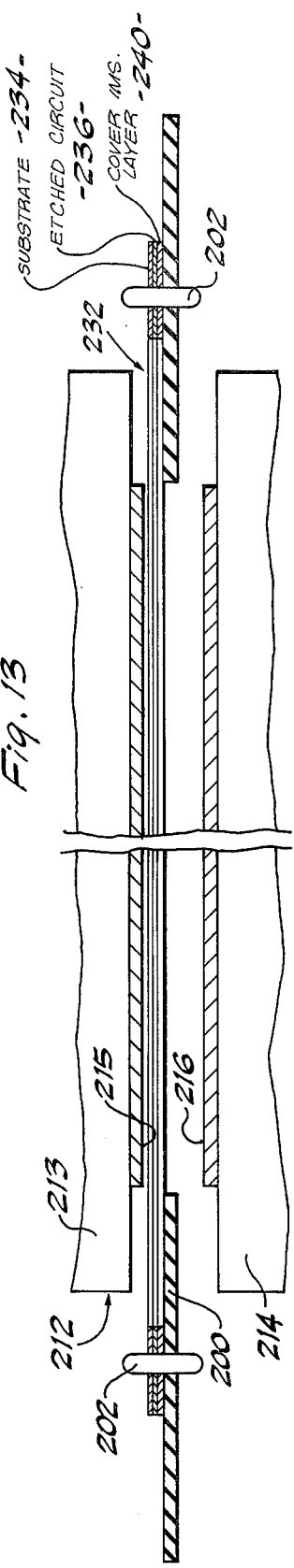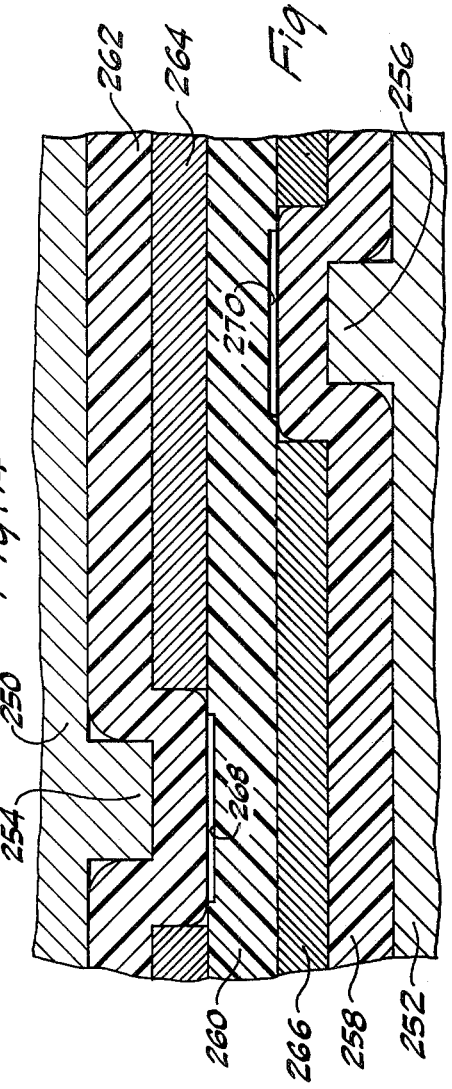

METHOD AND APPARATUS FOR INSULATING ELECTRICALLY CONDUCTIVE ELEMENTS

This is a division of application Ser. No. 426,246 filed Dec. 19, 1973, which in turn is a division of application Ser. No. 93,949, filed Dec. 1, 1970, now U.S. Pat. No. 3,802,974.

BACKGROUND OF THE INVENTION

1. Field of the Invention

The present invention relates to a method and apparatus for insulating elements and, more particularly, to a method and apparatus for simultaneously insulating a plurality of electrically conductive elements to achieve a more reliably bonded flat electrical cable in a more economical manner, for facilitating exposure of the electrically conductive elements to allow electrical contact to be made, and for bonding flexible electrical circuits.

2. Description of the Prior Art

Electrical cable is simply a plurality of electrically conductive elements aligned parallel one another in a predetermined spacing encapsulated (except for the ends of the cable) with synthetic resin electrical insulative material. Physically, the cable appears as a thin flexible strip of synthetic resin having small embedded metallic wires.

Efforts to make electrical cable less expensively, quicker, and more reliable have spawn many methods and apparatus exemplified by the prior art. One such method, sometimes referred to as the hot-roll method, comprises locating two grooved rollers closely adjacent one another, heating the rollers to a temperature to cause fusion of the synthetic resin insulative material used and passing a plurality of conductive elements sandwiched between insulative strips to achieve a bonded electrical cable. Another method, such as exemplified by U.S. Pat. No. 3,082,292 to R. W. Gore, comprises moving the sandwich of electrical wire and insulator between two grooved rollers and then passing the formed but unbonded cable to an oven to achieve bonding. Yet, another method as exemplified by U.S. Pat. No. 3,531,045 to L. L. Emmel et al., commonly referred to as the chill-roll process, comprises passing the layered electrically conductive elements and insulative material through a heating device to heat the entire unbonded cable to well over the temperature necessary for bonding and then passing the cable through two grooved rollers which are at a temperature below that of bonding.

Each of the prior art processes provided an unreliable bond, that is, fusion of the abutting surfaces of the insulative material could not be reliably accomplished without causing substantial difficulties with other portions of the cable. For example, some of the methods required heating to a substantially higher temperature than necessary to cause fusion to compensate for heat loss before maximum pressure is brought to bear to cause bonding; this excessive heat frequently oxidized the electrically conductive elements thereby making future electrical contact difficult. Excessive heat creates the generation of excessive amounts of gas causing gas bubbles in the cable. Still another problem related to internal stresses formed in the insulative material during the insulative material's manufacture. When heated, the areas, representing overly stressed and normally stressed regions, expand at different rates causing wrinkles in the insulative cover. Removing wrinkles requires critical machine adjustments and excessive machine tension applied to the insulative material during the cable-making process. Upon cutting such a cable for use, the insulative material tends to recede from the conductive elements leaving the ends of the conductive elements undesirably exposed. A further problem with overheating occurs after pressure has been released; if the cable is still above fusion temperature, there is a tendency for the insulative material to deform to its original flat shape and unbond. One solution to the latter problem is to use more adhesive material to retard undesirable deformation. However, this results in a cable which is substantially thicker than need be and which concurrently increases material expenses.

Another major difficulty facing the electrical cable industry and its customers is quickly, economically and reliably exposing the electrically conductive elements of a bonded cable to allow electrical contact to be made. Present methods include grinding away the insulative material in order to expose the conductive elements; this frequently causes damage to the conductive elements since it is difficult to accurately control the grinder. Another method includes the application of heat to the insulative material to allow its separation from the conductive elements; this causes deformation of the cable, oxidizes the conductive elements and enhances the chance of cable delamination. Neither of the above methods are suited for fully automatic operation since both methods disturb the positioning of the conductive elements which is critical for automatic connection to another electrical element such as an electrical connector having multiple electrical contact positions. For example, a three inch wide cable may easily contain sixty electrically conductive wires in alignment, each wire parallel to the others. Position tolerances are ± 0.0005 inches. Grinding, heating or cutting through insulation which may be 0.005 inches is exceedingly delicate and difficult.

Still another problem faces the flexible circuit industry. A flexible circuit may be defined as a specifically designed layer of electrically conductive material bonded between two layers of insulative material. Insuring a reliable bond between the two insulative layers and achieving this bond in a relatively short time span has always eluded solution.

SUMMARY OF THE INVENTION

A solution to all of the mentioned problems is accomplished by the present invention which provides a method for insulating an element comprising the steps of providing an element positioned between layers of insulative material; moving the element and the insulative material relative a first pressure station; selectively applying pressure to form the insulative material about the element; moving the formed insulated material and the element relative a second pressure station; and selectively applying pressure and sufficient heat to the insulative material to bond the layers. The invention further includes a method for simultaneously insulating a plurality of elements including the bonding of layers of insulative material about the plurality of elements with heat and pressure and for facilitating exposure of the elements at predetermined locations wherein the improvement comprises interrupting the application of pressure to predetermined locations of the insulative material.

In addition to the methods, the invention includes the apparatus for accomplishing the methods; that is, apparatus for manufacturing cable as well as apparatus for manufacturing flexible electrical circuits.

It is a general aim of the present invention to provide a method and apparatus for achieving a superior bonding of insulative material about an interior element. Other aspects of the present invention include bonding electrically insulative material about an electrically conductive element, the provision of a method and apparatus for reducing the heat required to achieve necessary bonding, for reducing the stress induced in the electrically insulative material, for eliminating the need to finely adjust the apparatus in response to excessive stresses in the insulative material, and for cooling the bonded material quickly so as to provide a permanent form.

A corollary aim of the present invention is to provide a method and apparatus for increasing the speed of cable manufacture in one embodiment and in another embodiment to increase the speed of flexible circuit manufacture.

Another object of the present invention is to provide a method and apparatus for forming the electrically insulative material about a plurality of electrically conductive elements and for bonding the insulative material in preselective locations only.

A further object of the present invention is to provide a method and apparatus for facilitating the exposure of the electrically conductive elements of a bonded cable.

Yet, a further aspect of the present invention is to provide a reliable and inexpensive manner for bonding flexible circuits.

Other objects and advantages of the invention will appear from the following description taken in conjunction with the accompanying drawings.

BRIEF DESCRIPTION OF THE DRAWINGS

FIG. 2 is an enlarged partly modified diagrammatic view of a portion of the embodiment shown in FIG. 1.

FIG. 3 is an enlarged elevational sectional view taken along line 3—3 of FIG. 2.

FIG. 4 is an enlarged diagrammatic elevational view taken within the circle 4—4 of FIG. 2.

FIG. 5 is an enlarged elevational sectional view taken along line 5—5 of FIG. 2.

FIG. 6 is an enlarged diagrammatic elevational view taken within the circle 6—6 of FIG. 2

FIG. 7 is a graph illustrating the temperature of the insulative material of a prior art process.

FIG. 8 is a graph illustrating the temperature of the insulative material of another prior art process.

FIG. 9 is a graph illustrating the temperature of the insulative material of the present inventive method.

FIG. 10 is an enlarged diagrammatic view of a portion of the view shown in FIG. 1 illustrating the forming and bonding rollers in a disengaging position.

FIG. 11 is an elevational sectional view of the unformed and unbonded cable taken along line 11—11 of FIG. 10.

FIG. 12 is a diagrammatic perspective view illustrating the exposure of the conductive elements.

FIG. 13 is a diagrammatic view of a method and an apparatus for manufacturing flexible circuits.

FIG. 14 is an elevational sectional view taken along line 14—14 of FIG. 13.

FIG. 15 is an enlarged diagrammatic view of a multilayer circuit between etched mold plates.

DESCRIPTION OF THE PREFERRED EMBODIMENTS

Figure 1:
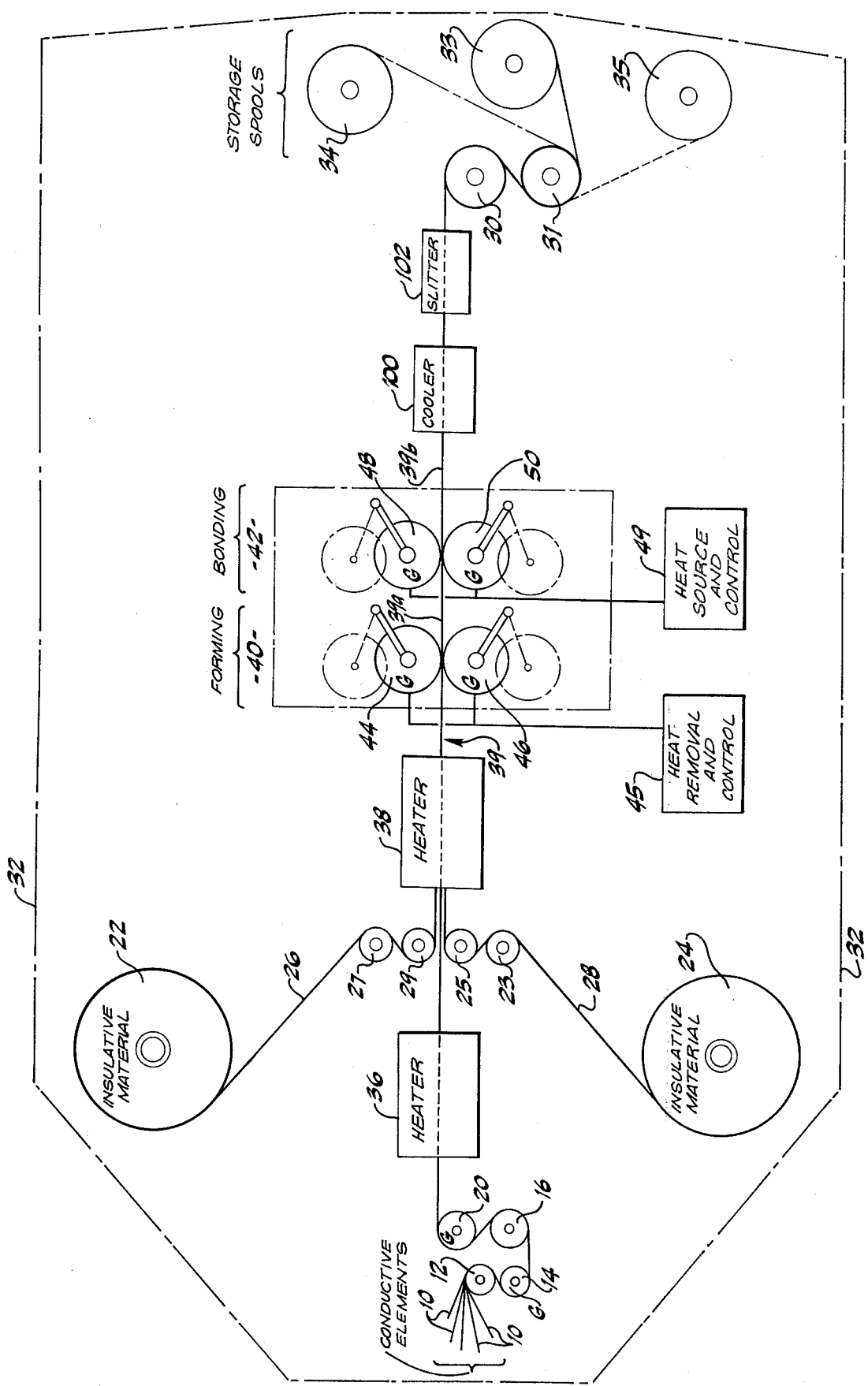
FIG. 1 is a diagrammatic view of a method and an apparatus for simultaneously insulating a plurality of aligned elements to produce a cable.

While the present invention is susceptible of various modifications and alternative constructions, illustrative embodiments are shown in the drawings and will herein be described in detail. It should be understood, however, that it is not the intention to limit the invention to the particular forms disclosed; but, on the contrary, the intention is to cover all modifications, equivalents and alternative constructions falling within the spirit and scope of the invention as expressed in the appended claims.

The product for which the present method and apparatus are directed may be generally described as a plurality of aligned electrically conductive elements insulated with a suitable synthetic resin material to provide a compact, flexible cable. This electrical cable has wide usage in compact systems; the cable, or harness as it is often referred to, acts to provide electrical paths between such components as printed circuit boards and provides a compact and light-weight element compatible with small components to form a very compact system.

Referring to FIG. 1, a number of electrically conductive elements 10 are brought together and aligned one from another by being passed around idler rollers or drums 12, 14, 16 and 20. It is preferable that the rollers 14 and 20 have grooves or recesses located in their outer surfaces in order to provide alignment guides for the conductive elements. The rollers are located so as to provide with drive rollers 30 and 31 a constant tension on the conductive elements which enhances alignment. Two oppositely disposed supply spools 22 and 24 are provided to supply an upper layer 26 of insulative material and a lower layer 28 of insulative material, respectively, so as to sandwich the conductive elements. The insulative materials are commonly referred to as "webs." The lower layer 28 passes between a drive roller 23 and an idler roller 25 which are in pressure contact while the upper layer 26 passes between a drive roller 27 and an idler roller 29 which are in pressure contact. To insure tension on the upper and lower layers of the insulative material, the velocity of rotation of the drive rollers 23 and 27 is somewhat less than the velocity of rotation of the drive rollers 30 and 31. Tension is easily adjusted by simply altering the relationship of the rotational velocity of the drive rollers 23 and 27 and the rotational velocity of the drive rollers 30 and 31. All of the elements mentioned thus far are suitably attached to a frame 32 (which is illustrated in diagrammatic outline form using phantom lines) as are storage spools 33, 34 and 35.

A major disadvantage of all prior art methods and apparatus has been the reliability of the bonding of the insulative layers for encapsulating the conductive elements. Often, for example, a cable is formed where the two layers of insulative material are brought together and apparently attached only to become delaminated upon handling. In accordance with one of the important aspects of the present invention, a cable is formed in which the two layers of insulative material are completely bonded so as to entrap the conductive elements to provide a flexible cable which is permanently formed. Referring once again to FIG. 1, the aligned conductive elements 10 are passed through a heater 36 which is connected to the frame 32. The conductive elements having the upper layer 26 of insulative material and the lower layer 28 of insulative material in alignment then move through a second heating station by being passed through a heater 38 which is attached to the frame 32. Each of the heaters are at a temperature to warm the conductive elements and the insulative material so as to increase the plasticity of the insulative material; nevertheless, the temperature is below that which would cause the insulative material to bond. During this time the plurality of conductive elements are in a parallel alignment relative one another as well as in planar alignment and are aligned relative the two layers of insulative material. The heaters 36 and 38 may comprise planar infra-red radiant heaters.

It is reiterated that the deficiencies in the prior art generally center about the supply of heat to the cable and proper timing of the application of pressure. Thus, in the hot-roll process, either the heat is insufficient to cause bonding because forming and bonding were performed simultaneously or too much heat was supplied so that the cable departed the location of pressure application excessively heated thereby allowing the deformation of the cable to its original condition. With other processes, excessive heat application caused excessive generation of gas which frequently formed undesirable gas pockets within the bonded cable. Further, the excessive application of heat causes the conductive elements to form an oxidation coating which requires removal before a reliable electrical connection can be made between the cable and another part of the system in which it is employed. Still another problem is that the insulative material is frequently received with high stress areas formed during its own manufacture. When heated, the high stress regions have a different rate of expansion than adjacent regions which causes excessive wrinkles at locations along the insulative material. Thus, it becomes necessary to critically tune the apparatus forming the cable by aligning to a high degree of precision the shafts for the supply spools and the rollers and increasing the tension on the preformed cable. When the cable is formed and severed for application, the increased tension used during manufacturing causes the insulative material to constrict once the tension is relieved so as to expose, undesirably, the conductive elements at the point of severance. Wrinkles also leave air pockets and folds in the final cable causing the cable to be rejected. Finally, the above difficulties require the speed of processing the cable through the apparatus to be relatively slow, thereby increasing manufacturing time and expense.

In accordance with an important aim of the present invention, a method and apparatus is provided which reduces the amount of heat necessary to cause bonding, reduces stress in the insulative material, eliminates the need for fine adjustment of the machine, increases the speed of production and substantially increases the reliability of the bond achieved.

To ensure proper and reliable bonding, the unformed cable 39 of the present invention is moved through a forming station 40 and a bonding station 42. The forming station 40 includes two adjacent rollers 44 and 46, or nips as they are frequently referred to, each connected to a heat removal and control unit 45. The bonding station 42 includes two adjacent rollers 48 and 50 each connected to a heat source and control unit 49.

Referring to FIGS. 3 and 5, the outer surfaces of the rollers are shown in more detail. For example, the roller 44 includes an outer surface having alternate ridges, such as ridges 64, 66 and 68, and recesses such as recesses 70 and 72; in a like manner, the roller 46 has an outer surface having ridges 74, 76 and 78 with alternate recesses 80 and 82. The roller 48 has an outer surface having alternate ridges 64a, 66a and 68a and recesses 70a and 72a; the roller 50 corresponds to the roller 48 with ridges 74a, 76a, 78a and recesses 80a and 82a.

To ensure a reliably bonded and permanently formed cable, the unformed cable is bonded in a two-step operation. First, the unformed cable moves between the rollers 44 and 46 of the forming station 40, FIGS. 2 and 4 and then between the rollers 48 and 50 of the bonding station 42, FIGS. 2 and 6. Returning once again to FIG. 3, the forming station rollers 44 and 46 use the conductive elements, as exemplified by the conductive elements 10a and 10b, as mandrels around which the two layers of insulative material 26 and 28 are cold formed. Prior to entering the forming rollers 44 and 46, the unformed cable was heated by the heater 38 to a temperature to increase its plasticity but below the temperature at which the insulative material fuses. When the unformed cable passes between the rollers 44 and 46, which applies pressure selectively to the regions of the insulative material between the locations of the aligned conductive elements, that is the ridges of the rollers aligned between the conductive element locations, there is a stretching of the insulative layers in the region where they pass over a conductive element while in the regions between the placement of the conductive element there is a squeezing of the insulative material causing it to cold flow about the conductive elements. It is important to note that prior to the forming station, the unformed cable was at an elevated temperature to increase its plasticity; the forming rollers 44 and 46, however, are at a lower temperature so as to cool the cable before it is moved to the bonding station. When pressure is applied by the forming rollers there is a desired cold flow of the insulative material about the conductive elements causing the insulative material to form in the desired manner; at the same time, there is a heat transfer (see FIGS. 3 and 4) from the unformed cable to the rollers causing the insulative material to cool and stabilize in the formed configuration. Thus, upon passing beyond the forming rollers 44 and 46, the cable which will be referred to as formed cable 39a, FIG. 1, appears visually to be finished bonded cable; however, as noted in FIG. 3, abutting surfaces 92 and 94 of the upper and lower layers of insulative material, respectively, are still clearly distinguishable.

It is to be understood that the heating step accomplished by the heater 38 may be dispensed with when using some insulative materials which are readily formed at room temperature; however, with the more popular insulative materials, it is contemplated that a heating step is desirable. The heating step not only increases the plasticity of the insulative material, but also serves to relieve any residual stresses present from the insulative material's manufacturing process.

In accordance with another important aspect of the present invention, the relatively cool formed cable is heated to bonding temperature at preselected locations only so as to minimize the total amount of heat transferred to the cable. Thus, all the disadvantages in the prior art due to excessive heating have been obviated. The bonding rollers are identical to the forming rollers, except that the bonding rollers are at a temperature at or slightly above that needed to bond the insulative material. Because only the ridges of the rollers such as ridges 64a, 66a, 68a, 74a, 76a and 78a, FIG. 5, come into contact with the insulative material (the recesses may be 0.005 to 0.010 inches from the insulatiive material) the heat of bonding is essentially transmitted through the ridges to the insulative material in the location where contact is made. For purposes of illustration, the locations are designated 91, 93 and 95. The transfer of heat is diagrammatically illustrated by wavy arrows. Any gas pockets remaining after the forming station are closed at the bonding station. The combination of heat sufficient to cause bonding and pressure assures a complete bonding of the two layers of insulative material so that the abutting surfaces of the formed cable are no longer distinguishable.

It is important, of course, that the formed cable be raised to the bonding temperature by the time maximum pressure is applied to the cable. Referring to FIG. 6, it is seen that because of the radial dimension of the rollers, there is contact between the insulative material and the rollers prior to the time that full pressure is applied; full pressure is applied to the insulative material at a location which is coincident with a line representing the shortest distance between the centers of the rollers 48 and 50 and depicted in FIG. 6 by the letters "P" and the vertical arrows (see also FIG. 4). Since the thickness of the insulative material ranges from 0.002 to 0.010 inches, heating is sufficiently rapid to cause bonding when the maximum pressure is applied. Of course, it is understood that the rate of heat conduction through the insulative material is a function of the particular material used and the velocity through which the cable is moved through the bonding station.

Just as important as the addition of heat is the very rapid cooling which is to occur after the location of maximum pressure has been passed so that the cable does not have a chance to deform while at a high temperature. To accomplish rapid cooling, the formed cable, as mentioned, is cooled by the forming rollers 44 and 46 to a relatively low temperature. The cable is heated by the bonding rollers only in the locations 91, 93 and 95, FIG. 5, establishing a substantial temperature gradient over the width of the cable causing a heat flow from the highly heated regions to the cooler regions which are occupied by and immediately adjacent the conductive elements. Since good electrically conductive elements are generally also excellent heat conductive elements, there is a rapid dissipation of the heat by conduction through the conductive elements as well as dissipation of heat through the immediate environment by the usual convection process; thus, very rapid cooling is affected immediately upon leaving the high temperature bonding rollers so that the bond and the formation of the cable is permanent. By way of example, it is contemplated that the locations 91, 93 and 95 will occupy approximately 30 percent of the width of the cable so that only 30 percent of the cable receives heat sufficient for bonding. Because of the low total amount of heat applied for bonding and because of the forming step, there is less insulative layer distortion and no conductive element position shifts. Hence, a wider cable may be processed achieving a greater production per unit of time. It is to be appreciated that the initial cold forming of the insulative material about the conductive elements using the conductive elements as mandrels, the cooling of the insulative material and the conductive elements prior to the bonding station, and the application of heat to limited locations of the cable establishes a major advantage for the present method and apparatus; that is, a reduction in the amount of heat transferred to the cable with its corollary disadvantages of excessive gas, oxidation of the conductive elements and redeformation after removal of the bonding pressure.

To emphasize the differences between the prior art and the present invention, reference is made to FIGS. 7, 8 and 9 illustrating a "heating" curve for the insulative material during three manufacturing processes. The hot-roll process, FIG. 7, shows by the curve 200 the insulative material is heated above the bonding temperature at the hot roller station 202 and has a very slow heat dissipation rate as exemplified by the curve portion 204. If the temperature is above bonding after leaving the rollers, deformation is likely to occur. The chill-roll process, FIG. 8, shows the curve 206 substantially above the bonding temperature line 208 so as to allow forming and bonding in the cool roller station 210. The disadvantages of excessive heating have already been mentioned. The present method, FIG. 9, shows the curve 212 well below the bonding temperature line 214 during forming at the cool roller station 216 and only slightly above the line 214 at the bonding station 218. It is to be noted that in the hot and chill-roll processes, the insulative material is heated along its entire width above the bonding temperature, while in the present method, only a relatively small portion of the cable is heated to bonding temperature. Hence, there is a very rapid drop in temperature after passing the bonding station 218. Therefore, not only does the concept of forming and bonding at two separate stations provide a superior result, but in more detail the superior results are achieved by forming about the conductive element so as to use them as mandrels and then, cooling prior to bonding followed by bonding at selected locations only.

By way of example, "Teflon" (a trademark) polytetrafluoroethylene (TFE) material coated with fluorinated ethylene-propylene (FEP) has been found to be a suitable synthetic resin insulative material with the FEP having a temperature of fusion of about 530° F. As mentioned, the material is produced in thicknesses for the purpose of forming cable between 0.002 to 0.010 inches. It is contemplated that the heater 38 will heat the unformed cable to a temperature of about 450° F to cause desired plasticity of the TFE while the rollers 44 and 46 are maintained at a temperature of about 100° F. Thus, the formed cable will be at some temperature close to that of the rollers 44 and 46. The bonding rollers 48 and 50 are maintained at a temperature of about 550° F so as to provide sufficient heat for fusion of the FEP coatings. The process proceeds at about 40 feet per minute. By way of comparison, the FEP coated TFE is a milky blue color at 530° F, tan at room temperature and transparent at 640° F. In the chill-roll process described hereinabove, it was necessary to heat the material to the transparent condition in order to achieve a suitable bond. It is understood that TFE will not fuse to itself if its temperature is increased; thus, a coating of FEP is necessary to achieve bonding. However, if FEP alone is used as the insulative material, heating to about 530° F will cause fusion and thus bonding when pressure is applied.

The forming station and bonding station rollers are of identical design so as to be interchangeable; each has removable sleeves to provide the desired groove profile. The rollers may be made of aluminum with stainless steel sleeves and with a small core for the insertion of a resistance rod heater. It is to be understood that only one roller of each pair may be grooved, i.e. have alternating ridges and recesses depending upon the insulative material used. Further, there may be a temperature differential between each roller of a pair; for example, it may be necessary for only the roller 48 to be at or above bonding temperature to cause reliable bonding. Whether or not both rollers need have the same temperature may depend upon the velocity of the process and the insulative material used. It is to be understood further that the conductive elements may be round or generally rectangular in cross section or any other convenient shape without detracting from the invention herein.

It is contemplated that the method and apparatus described may be used for other than manufacturing electrical cable. For example, optical fibre may be insulated in the same fashion or preinsulated wires may be brought together and supported by being encased within a cable. Hence, the term insulative material may apply to electrically insulative, thermally insulative or force (impact) insulative for example.

The bonded cable 39b proceeds to a cooler 100 which may be a roller at a low temperature before proceeding to a slitter 102 which may be provided to cut the bonded cable along a direction parallel to the longitudinal axis of the conductive elements to form whatever width cable is desired.

Referring to FIG. 2, a modified apparatus is illustrated in phantom line including a conveyor belt 140 to support a cable which is weak in tensile strength. The belt carries the tensile load. Such a fragile cable is one with relatively small conductive elements which may have the insulative material formed and bonded by grooved upper rollers only.

In accordance with another important aspect of the present invention, provision is made for facilitating exposure of the conductive elements to allow an electrical connection to be made with the cable. As mentioned hereinabove, various methods exist for exposing the conductive elements of a bonded cable. The present invention contemplates passing preselected portions of the unformed cable 39 through the forming and/or bonding stations without the application of pressure and/or heat. This is accomplished by mounting the rollers 44, 46, 48 and 50 to links 110, 112, 114 and 116, FIG. 10, respectively, which in turn are pivotally mounted about shafts 118, 120, 122 and 124, respectively. Thus, the rollers are movable from the position shown in FIGS. 1 and 2 to the position shown in FIG. 10. Movement of the rollers from one position to another can be accomplished manually or by a motor and timing mechanism 126. The way in which bonding is prevented may be accomplished by any one of the following: pivoting the bonding rollers 48 and 50 so as to prevent actual bonding; pivoting the forming rollers 44 and 46 so as to prevent an optimum bond; or preferably operating the forming station rollers and the bonding station rollers in sequence so that the preselected portion is neither formed nor bonded. When working in sequence, one pair of rollers is always closed to insure alignment of the conductive elements. Referring to FIG. 11, the insulative layers 26 and 28 remain in a sandwich about the conductive elements 10a, 10b, 10c, 10d and 10e without bonding and formation taking place.

Referring now to FIG. 12, exposure of the conductive elements 10a, 10b, 10d and 10e is easily accomplished by cutting through the layers 26 and 28 of the insulative material in that region which has not been bonded. It has been found that the unbonded regions, perhaps several inches in length, will balloon outwardly so that cutting and removing of the insulative material is easily accomplished without damaging or misaligning the conductive elements. The insulative material may be folded back from the cut to form flaps 130, 132, 134 and 136 or the flaps may be suitably cut away. Another major advantage of the present method and apparatus is that accomplishing the preparation of the cable to allow easy exposure of the conductive elements does not require stopping the cable manufacturing apparatus nor in any other way disrupting the process.

In accordance with yet another important aspect of the present invention, provision is made for substantially increasing the rate of production of flexible electrical circuits and for providing a reliable bond between various layers of insulative material. A flexible circuit is somewhat analogous to electrical cable in that the flexible circuit generally comprises a substrate layer or film of insulative material bonded or laminated to a layer or film of electrically conductive material. The conductive material is covered with a second layer or film of insulative material; it is to be understood that an alternating pattern of multiple conductive layers and insulative layers may be formed. The process of making a flexible circuit includes attaching the substrate layer of insulative material and the conductive layer in a suitable fashion followed by the removal, selectively, of conductive material to provide a preselected circuit designed. The removal process often is accomplished by chemical etching and is well known in the industry. After the circuit has been formed by the conductive material, the cover layer of insulative material is then attached. It is the attachment of the cover layer of insulative material which is causing problems by requiring an excessive amount of equipment time to accomplish and by not achieving a reliable result.

One prior art method used to bond the cover layer of insulative material to the remainder of the circuit is to sandwich the material in a press, heat the press so as to apply the proper bonding temperature and pressure and then cool the entire press so as to allow the circuit to solidify. After the cooled circuit is removed, the entire press must then be reheated for the next cycle. Presently, if the insulative material is FEP such a cycle may take upwards of twenty-five minutes.

Referring now to FIGS. 13, 14 and 15, the concept of the method described hereinabove with regard to the manufacture of electrical cable is adaptable to the manufacture of flexible circuits. The new method would comprise placing a layer of insulative material and a formed circuit pattern bonded to a substrate on a conveyor belt 200 having small pegs 202 for locating the flexible circuits. The conveyor belt is driven about two drums, a brake drum 204 and a driving drum 208. The belt is driven in a step and repeat fashion through the various stations of the process; that is, the belt moves from station to station with stops at each station for a predetermined period of time. First, the flexible circuit is positioned within a heater 210 for increasing the plasticity of the insulative material much in the same fashion as the heater 38 of FIG. 1 increases the plasticity of the insulative material of the cable. Secondly, the heated flexible circuit is moved to a forming station comprising a press 212 having an upper platen 213 and a lower platen 214. An etched mold plate 215 is attached to the upper platen while an etched mold plate 216 is attached to the lower platen. The temperature of the press 212 is below that of the unformed circuit. When the press is closed, the insulative material is cold formed about the conductive material while at the same time being cooled similar in fashion to the function of the first set of rollers 44, 46, FIG. 1.

The formed and cooled flexible circuit is then moved to a bonding station, which includes a bonding press 218 having an upper platen 219, upper etched mold plate 220, lower platen 221 and lower etched mold plate 222. The press is at a temperature above that of bonding of the insulative material. The press is closed to apply the pressure and heat sufficient to cause bonding in a fashion analogous to the operation of the bonding rollers 48 and 50 of FIG. 1. The flexible circuit is then moved to a trimming station which includes still another press 223 having specially formed heads 224 and 225 to trim the flexible circuit in the desired fashion. The flexible circuit which has been trimmed is moved beyond the trimming station to allow its removal from the conveyor belt. Hence, a rapid but reliable bond is achieved between the insulative layers of the flexible circuit.

Referring now to FIG. 14, there is shown in more detail a cross section of the forming station press 212. The flexible circuit 232 is positioned on the conveyor belt 200 located by two oppositely disposed series of pins 202, and is comprised of a substrate layer 234 to which is bonded a layer of conductive material 236. A cover layer of insulative material 240 is sandwiched between the conductive material and the conveyor belt. The lower platen or ram portion 214 with the etched mold plate 216 is then moved upwardly to compress the layered flexible circuit against the upper platen 213. At least the lower ram platen 214 is at a temperature lower than that of the flexible circuit so that the flexible circuit is cold formed while at the same time being cooled. At the bonding station at least the lower platen 221 is heated to a temperature slightly above that necessary to cause bonding.

Referring now to FIG. 15, a multilayer flexible circuit is illustrated between an upper mold plate 250 and a lower mold plate 252, both of which are etched to have ridges such as the ridge 254 of the upper plate and ridge 256 of the lower plate. The circuit includes three layers of insulative material, a bottom layer 258, a middle layer 260 and an upper layer 262. Located to each side of the middle layer 260 are two metallic electrically conductive elements 264 and 266. As shown, there are gaps between the conductive elements which ideally should be enclosed with an insulative material to prevent possible short circuiting. This is accomplished by forming and then bonding the upper layer 262 to the middle layer 260 at a region designated 268 while at the same time bonding the lower layer 258 to the middle layer 260 at the region designated 270. The etched mold plates 250 and 252 are designed to have properly dimensioned and located ridges aligned with the regions 268, 270. Once again, it is appreciated that the process of heating to relieve stresses, cold forming to provide cold flow of the material and to facilitate heat conduction after the bonding stage, followed by selective heating to the temperature of bonding is accomplished easily and quickly. As with the cable method, the electrically conductive layers 264 and 266 act as heat conducting path to cool the circuit as soon as bonding has been accomplished to lower the temperature and prevent deformation.

I claim:

1. A method for insulating a predesigned electrically conductive layer bonded to a layer of insulative material comprising the steps of:

providing a predesigned electrically conductive layer bonded to a substrate layer of insulative material;

positioning a covering layer of insulative material over said conductive layer bonded to said substrate layer;

heating said substrate and covering layer of insulative material to a degree insufficient to cause bonding of said insulative material;

positioning said substrate layer with said conductive layer bonded thereto and said covering layer on a conveyor belt;

moving said substrate layer with said conductive layer bonded thereto and said covering layer relative a first pressure station, said first pressure station including at least one mold plate and having a face pattern of recesses and ridges;

selectively applying pressure to form said substrate layer and said covering layer of insulative material about said predesigned electrically conductive layer substantially maintaining a distinguishable and separable interface between said substrate and said covering layer;

moving the formed substrate and covering layer of insulative material with said predesigned electrically conductive layer therebetween relative a second pressure station, said second pressure station including at least one mold plate having a face pattern of recesses and ridges; and selectively applying pressure and sufficient heat substantially simultaneously to predetermined regions of said formed substrate and covering layers of insulative material to bond said substrate and said covering layers at said predetermined regions.

* * * * *